United States Patent
Morita et al.

(10) Patent No.: US 7,508,072 B2
(45) Date of Patent: Mar. 24, 2009

(54) SEMICONDUCTOR DEVICE WITH PAD ELECTRODE FOR TESTING AND MANUFACTURING METHOD OF THE SAME

(75) Inventors: Yuichi Morita, Gunma (JP); Shinzo Ishibe, Gunma (JP); Takashi Noma, Gunma (JP); Hisao Otsuka, Gunma (JP); Yukihiro Takao, Gunma (JP); Hiroshi Kanamori, Tokyo (JP)

(73) Assignee: Sanyo Electric Co., Ltd., Osaka (JP)

( * ) Notice: Subject to any disclaimer, the term of this patent is extended or adjusted under 35 U.S.C. 154(b) by 33 days.

(21) Appl. No.: 11/529,553

(22) Filed: Sep. 29, 2006

(65) Prior Publication Data

US 2007/0075425 A1  Apr. 5, 2007

(30) Foreign Application Priority Data

Sep. 29, 2005  (JP) ............................. 2005-284022

(51) Int. Cl.
*H01L 23/48* (2006.01)
*H01L 21/44* (2006.01)

(52) U.S. Cl. .................. 257/737; 257/E23.02; 257/781; 257/680; 257/E23.021; 257/E21.597; 257/700; 257/701; 257/773; 257/758; 257/738; 257/734; 438/613; 438/614

(58) Field of Classification Search .................. 257/737, 257/781, E23.02, E23.021, 734, 738, 773, 257/700, 701, 758; 438/614, 613
See application file for complete search history.

(56) References Cited

U.S. PATENT DOCUMENTS

| | | | |
|---|---|---|---|
| 5,343,071 A * | 8/1994 | Kazior et al. ............... | 257/621 |
| 5,366,794 A * | 11/1994 | Nakao ........................ | 428/209 |
| 5,854,513 A | 12/1998 | Kim | |
| 5,986,460 A | 11/1999 | Kawakami | |
| 6,063,640 A | 5/2000 | Mizukoshi et al. | |
| 6,373,143 B1 | 4/2002 | Bell | |
| 6,512,292 B1 * | 1/2003 | Armbrust et al. ............ | 257/712 |
| 6,628,127 B2 * | 9/2003 | Takemoto et al. ........... | 324/754 |
| 6,841,875 B2 * | 1/2005 | Ohsumi ....................... | 257/738 |
| 2002/0066960 A1 * | 6/2002 | Ring ........................... | 257/774 |
| 2002/0119650 A1 | 8/2002 | Whetsel et al. | |

(Continued)

FOREIGN PATENT DOCUMENTS

CN  1435872 A  8/2003

(Continued)

OTHER PUBLICATIONS

European Search report mailed on Aug. 7, 2008 directed at counterpart application EP 06 02 0446.8; 5 pages.

*Primary Examiner*—Alexander O Williams
(74) *Attorney, Agent, or Firm*—Morrison & Foerster LLP

(57) ABSTRACT

The invention prevents a pad electrode for external connection of a semiconductor device from being damaged. An electronic circuit, a first pad electrode connected to the electronic circuit, and a second pad electrode connected to the first pad electrode are formed on a semiconductor substrate. A first protection film is formed, covering the first pad electrode and having an opening on the second pad electrode only. A wiring layer is further formed, being connected to the back surface of the first pad electrode through a via hole penetrating the semiconductor substrate and extending from the via hole onto the back surface of the semiconductor substrate.

13 Claims, 5 Drawing Sheets

U.S. PATENT DOCUMENTS

| | | | |
|---|---|---|---|
| 2003/0038367 A1* | 2/2003 | Yamaguchi | 257/734 |
| 2004/0063268 A1 | 4/2004 | Noma et al. | |
| 2005/0006783 A1 | 1/2005 | Takao | |
| 2005/0056903 A1 | 3/2005 | Yamamoto et al. | |
| 2006/0022287 A1* | 2/2006 | Itoi et al. | 257/421 |
| 2007/0257373 A1* | 11/2007 | Akram et al. | 257/774 |

FOREIGN PATENT DOCUMENTS

| | | | |
|---|---|---|---|
| CN | 1574324 A | | 2/2005 |
| EP | 0472357 | | 2/1992 |
| GB | 2311652 | | 10/1997 |
| JP | 2001-102482 | * | 4/2001 |
| JP | 2003-309221 | | 10/2003 |
| WO | WO-99/40624 | | 8/1999 |

* cited by examiner

SEMICONDUCTOR DEVICE WITH PAD ELECTRODE FOR TESTING AND MANUFACTURING METHOD OF THE SAME

CROSS-REFERENCE OF THE INVENTION

This application claims priority from Japanese Patent Application No. 2005-284022, the content of which is incorporated herein by reference in its entirety.

BACKGROUND OF THE INVENTION

1. Field of the Invention

The invention relates to a semiconductor device and a manufacturing method thereof, particularly, a semiconductor device having a via hole penetrating a semiconductor substrate and a manufacturing method thereof.

2. Description of the Related Art

A CSP (Chip Size Package) has received attention as a new packaging technology in recent years. The CSP is a small package having almost the same outside dimensions as those of a semiconductor die packaged in it. A BGA (Ball Grid Array) type semiconductor device has been known as a kind of the CSP.

This kind of semiconductor device has a wiring layer connected to a pad electrode on its front surface through a via hole penetrating a semiconductor substrate. A plurality of ball-shaped conductive terminals made of metal such as solder is arrayed in a grid on the back surface of the semiconductor substrate, and these conductive terminals are connected to the pad electrodes through the wiring layer. When this semiconductor device is mounted on electronic equipment, each of the conductive terminals is electrically connected to a circuit board, for example, wiring patterns on a printed circuit board.

Such a BGA type semiconductor device has advantages in providing a large number of conductive terminals and in reducing size over the other CSP type semiconductor devices such as an SOP (Small Outline Package) and a QFP (Quad Flat Package), which have lead pins protruding from their sides.

FIGS. 8 and 9 are cross-sectional views showing a structure and a manufacturing method of a BGA type semiconductor device, showing the periphery of a pad electrode in particular. A pad electrode 52 is formed on the front surface of a semiconductor substrate 50 with a first insulation film 51 interposed therebetween, and a first protection film 53 having an opening on this pad electrode 52 and covering the first insulation film 51 and the end portion of the pad electrode 52 is formed as shown in FIG. 8. The pad electrode 52 is connected to an electronic circuit (not shown) formed on the semiconductor substrate 50, and signals are sent between the electronic circuit and an external circuit through this pad electrode 52.

After the electronic circuit is formed on the semiconductor substrate 50 through a wafer process of a semiconductor, a test is executed to check whether or not the electronic circuit operates normally. At this time, a measuring needle 54 is brought into contact with the front surface of the pad electrode 52 through the opening provided to the first protection film 53. Although only one pad electrode 52 is shown in FIG. 8, a plurality of pad electrodes 52 is actually formed on the semiconductor substrate 50 in the same manner. The measuring needle 54 is connected to an LSI tester 100. A test signal is then sent from the LSI tester 100 to the electronic circuit through the measuring needle 54 and the pad electrode 52, and the LSI tester 100 receives a response signal from the electronic circuit in the reverse course, thereby completing the test measurement of the electronic circuit.

The semiconductor substrate 50 completing the above test measurement is sent to the subsequent process, and then a via hole, a wiring, a ball-shaped conductive terminal and so on are formed thereon. In detail, a glass substrate 56 for supporting the semiconductor substrate 50 is attached on the front surface of the semiconductor substrate 50 with a resin film for attachment 55 interposed therebetween as shown in FIG. 9. Then, a via hole 57 penetrating the semiconductor substrate 50 is formed, a second insulation film 58 covering the sidewall of the via hole 57 and the back surface of the semiconductor substrate 50 is formed, and a wiring layer 59 connected to the back surface of the pad electrode 52 through the via hole 57 and extending onto the back surface of the semiconductor substrate 50 is formed. Then, a second protection film 60 covering the back surface of the semiconductor substrate 50 and having an opening on the wiring layer 59 is formed, and a ball-shaped conductive terminal 61 is formed therein, being connected to the wiring layer 59 through this opening. The relevant technology is disclosed in Japanese Patent Application Publication No. 2003-309221.

In the described BGA type semiconductor device, however, the pad electrode 52 is damaged since an end portion of the measuring needle 54 is in contact with the pad electrode 52 by pressure in the test of the electronic circuit, and this damage easily causes moisture infiltration and corrosion of the pad electrode 52.

Furthermore, since an opening K of the first protection film 53 is provided on the pad electrode 52, fixing of the pad electrode 52 is unstable in a vertical direction after the via hole 57 is formed, and the pad electrode 52 warps at its center portion or cracks in the worse case by a heat treatment after the via hole 57 is formed. To raise a concrete example of the influence of the heat treatment, when the second insulation film 58 is made of an organic film such as a photoresist, a baking treatment is performed for setting the organic film. The second insulation film 58 shrinks in this treatment, and downward tensile stress occurs to the pad electrode 52. This tensile stress causes the pad electrode 52 warping at its center.

SUMMARY OF THE INVENTION

The invention provides a semiconductor device that includes a semiconductor substrate having a front surface and a back surface and having a via hole connecting the front and back surfaces, an electronic circuit disposed on the front surface, a first pad electrode disposed on the front surface so as to cover the via hole and connected with the electronic circuit, a second pad electrode disposed on the front surface and connected with the first pad electrode, a protection film disposed on the front surface so as to cover the whole first pad electrode and not to cover part of the second pad electrode, and a wiring layer disposed on the back surface so as to be in contact with the first pad electrode through the via hole.

The invention also provides a method of manufacturing a semiconductor device. The method includes providing a device intermediate including a semiconductor substrate, an electronic circuit disposed on a front surface of the semiconductor substrate, a first pad electrode disposed on the front surface and connected with the electronic circuit and a second pad electrode disposed on the front surface and connected with the first pad electrode. The method also includes forming a protection film on the front surface so as to cover the first pad electrode and not to cover part of the second pad electrode, forming a via hole from a back surface of the semiconductor substrate toward the first pad electrode, and forming a wiring layer on the back surface so as to be in contact with the first pad electrode through the via hole.

DETAILED DESCRIPTION OF THE INVENTION

Figure 1:
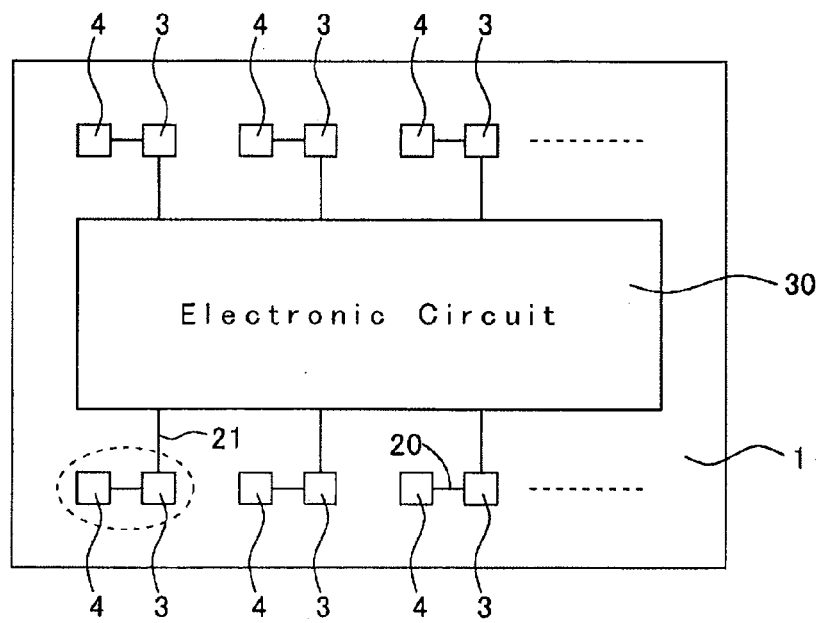
FIG. 1 is a plan view of a whole semiconductor device of an embodiment of the invention.

An embodiment of the invention will be described referring to figures. FIG. 1 is a plan view of a whole semiconductor device when a wafer process is completed, FIG. 2 is an enlargement view of a portion enclosed with a broken line in FIG. 1, and FIG. 3 is a cross-sectional view of FIG. 2 along line X-X.

Figure 2:
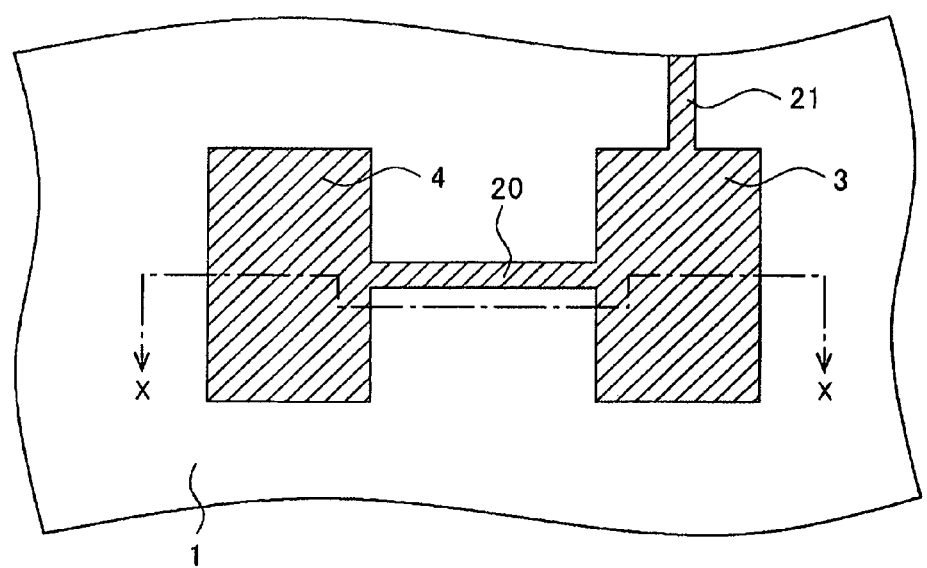
FIG. 2 is an enlargement view of a portion enclosed with a broken line in FIG. 1.

An electronic circuit 30 (a semiconductor integrated circuit), a first pad electrode 3, and a second pad electrode 4 disposed near the first pad electrode 3 and connected thereto through a wiring 20 are formed on a front surface of a semiconductor substrate 1 made of silicon or the like as shown in FIGS. 1 and 2. The first pad electrode 3 is a pad for external connection, and connected to the electronic circuit 30 through a wiring 21. That is, signals are sent between the electronic circuit 30 and an external circuit through the first pad electrode 3. The second pad electrode 4 is a pad for measuring the electronic circuit 30. The electronic circuit 30 is, for example, a CCD (Charge Coupled Device), a light receiving element such as an infrared ray sensor, or a light emissive element, but may be other electronic circuits.

Figure 3:
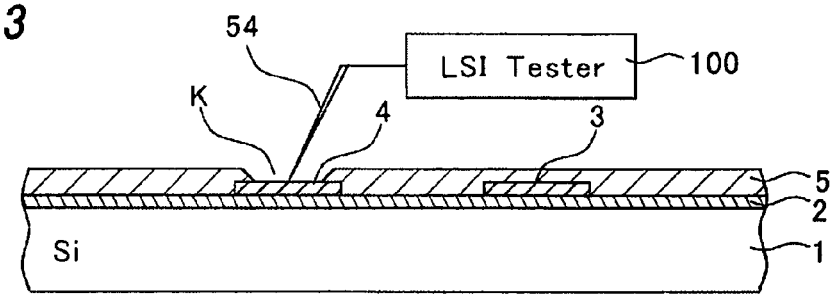
FIG. 3 is a cross-sectional view of FIG. 2 along line X-X.

The first pad electrode 3 and the second pad electrode 4 are formed on a first insulation film 2 on the front surface of the semiconductor substrate 1 by thermal oxidation or the like as shown in the cross-sectional view of FIG. 3. The first pad electrode 3 and the second pad electrode 4 are formed by sputtering aluminum (Al), for example, and preferably have a thickness of about 1 µm. The first insulation film 2 is made of, for example, a silicon oxide film, and preferably has a thickness of about 0.8 µm.

A first protection film 5 is formed by a CVD method or the like, covering the first insulation film 2, the first pad electrode 3 and an end portion of the second pad electrode 4 and having an opening K exposing the front surface of the second pad electrode 4. The first protection film 5 is, for example, a passivation film made of a silicon nitride film.

Then, a measuring needle 54 is brought into contact with the front surface of the second pad electrode 4 through the opening K of the first protection film 5 to execute a test of checking whether or not the electronic circuit 30 operates normally. The measuring needle 54 is connected to an LSI tester 100. A test signal is then sent from the LSI tester 100 to the electronic circuit 30 through the measuring needle 54, the second pad electrode 4, and the first pad electrode 3, and the LSI tester 100 receives a response signal from the electronic circuit 30 in the reverse route, thereby completing the test of measuring the electronic circuit 30. At this time, since an end portion of the measuring needle 54 is in contact with the second pad electrode 4 by pressure, the second pad electrode 4 is damaged, but the first pad electrode 3 remains undamaged. Therefore, even if the second pad electrode 4 corrodes by the damage, the first pad electrode 3 does not corrode and thus can function as an external connection terminal without problems.

Figure 4:
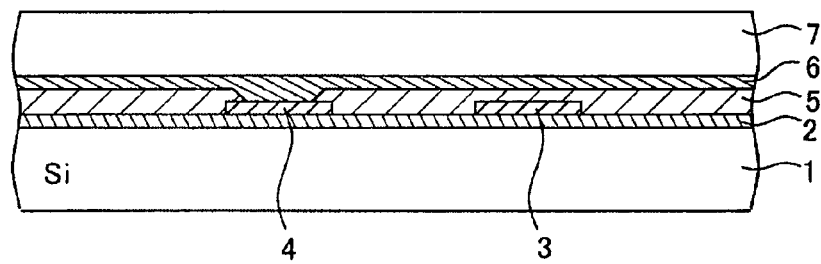
FIGS. 4 to 7 are cross-sectional views showing a method of manufacturing the semiconductor device of the embodiment of the invention.

After this measuring test, it is possible to form a supporting body 7 on the front surface of the semiconductor substrate 1 according to needs as shown in FIG. 4. This supporting body 7 is formed on the front surface of the semiconductor substrate 1 with a resin layer 6 interposed therebetween. When the electronic circuit 30 is a light receiving element or a light emissive element, the supporting body 7 is made of, for example, a transparent or semitransparent material such as glass. When the electronic circuit 30 is not a light receiving element or a light emissive element, the supporting body 7 is not necessarily made of a transparent or semitransparent material. Furthermore, a tape may be used as the supporting body 7. This supporting body 7 can be removed in a subsequent process, or left as it is without removed.

Figure 5:
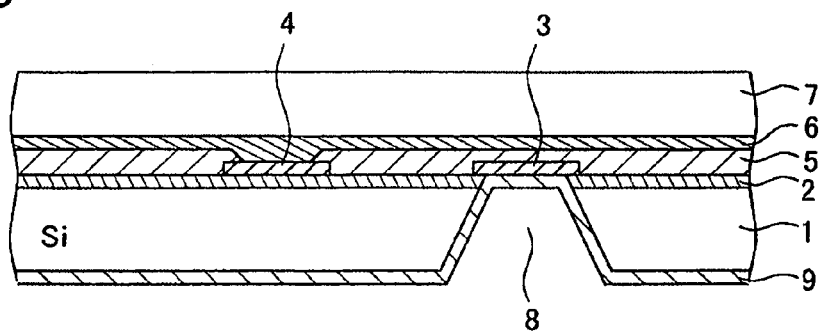

Next, the semiconductor substrate 1 is selectively etched (preferably dry-etched) from its back surface as shown in FIG. 5. When the semiconductor substrate 1 is made of silicon, $CHF_3$ or the like can be used as an etching gas for the dry-etching. This etching forms a via hole 8 penetrating the semiconductor substrate 1 from its back surface to its front surface in a position corresponding to the first pad electrode 3. The first insulation film 2 is exposed at a bottom of the via hole 8, and the first pad electrode 3 is in contact with the first insulation film 2 thereunder. Then, dry-etching or wet-etching is further performed to thin or completely remove the first insulation film 2 exposed at the bottom of the via hole 8. Alternatively, the process of etching the first insulation film 2 can be performed at the same time as the other etching process described below without performed at this time.

Next, a second insulation film 9 is formed on the whole back surface of the semiconductor substrate 1 including in the via hole 8. The second insulation film 9 is an organic film such as a photoresist, for example. In this case, after the second insulation film 9 is formed, a baking treatment for setting the second insulation film 9 is performed. In this process, the second insulation film 9 shrinks to cause tensile stress at the first pad electrode 3. However, since the first protection film 5 is fixed on the front surface of the first pad electrode 3, the tensile stress is removed by the first protection film 5 to prevent the first pad electrode 3 from warping. Then, the second insulation film 9 is patterned by exposure and development, the second insulation film 9 at the bottom of the via hole 8 is removed, and the back surface of the first pad electrode 3 is exposed. The second insulation film 9 remains on the back surface of the first semiconductor substrate 1 and the sidewall of the via hole 8.

The second insulation film 9 can be made of a silicon oxide film ($SiO_2$ film) or a silicon nitride film (SiN film) by a plasma CVD method, for example. In this case, a resist layer (not shown) is formed on the second insulation film 9, and the second insulation film 9 (including the first insulation film 2 when it remains) at the bottom of the via hole 8 is removed by etching using this resist layer as a mask. This etching is preferably reactive ion etching, for example, but the other etching can be used instead. By this etching, the back surface of the first pad electrode 3 can be exposed with leaving the second insulation film 9 on the sidewall of the via hole 8 and removing the first insulation film 2 at the bottom.

Figure 6:
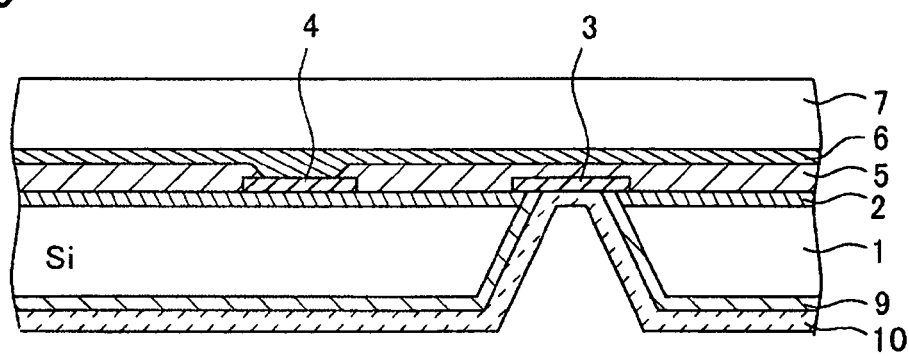

Next, a wiring layer 10 connected to the back surface of the first pad electrode 3 through the via hole 8 and extending from the via hole 8 onto the back surface of the semiconductor substrate 1 is formed as shown in FIG. 6. The wiring layer 10 can be formed by a sputtering method with metal such as aluminum and the subsequent selective etching. Alternatively, the wiring layer 10 can be formed by an electrolytic plating method. In this case, a seed layer is formed on the second insulation film 9 on the back surface of the semiconductor substrate 1 including in the via hole 8, and the wiring layer 10 made of copper (Cu) is formed on this seed layer by an electrolytic plating method. A plating thickness is adjusted so that the wiring layer 10 completely or not completely fills the via hole 8. The seed layer is formed by layering a metal layer, for example, a titanium tungsten (TiW) layer, a titanium nitride (TiN) layer, or a tantalum nitride (TaN) layer, and a metal layer made of copper (Cu) or the like. The seed layer is formed by, for example, a sputtering method, a CVD method, an electroless plating method, or the other deposition method. When the second insulation film 9 on the sidewall of the via hole 8 is made of a silicon nitride film (SiN film), the seed layer can have a single layer structure of copper (Cu) since the silicon nitride film (SiN film) functions as a barrier against copper diffusion.

Figure 7:
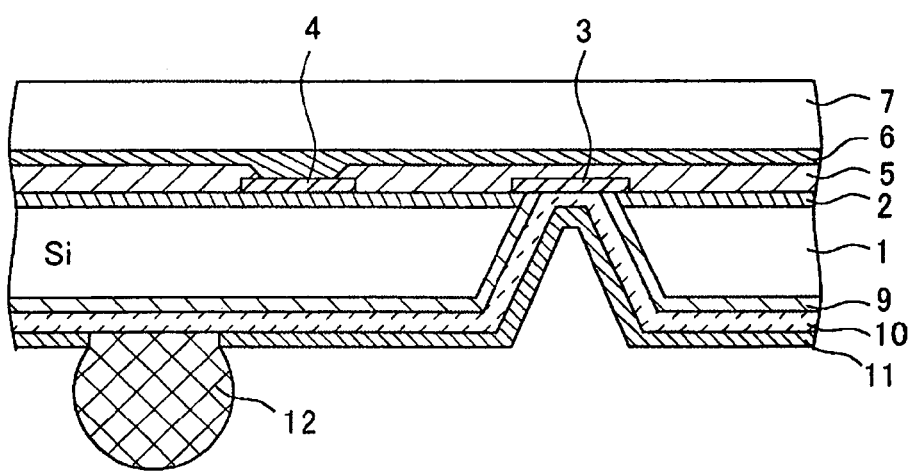
Figure 8:
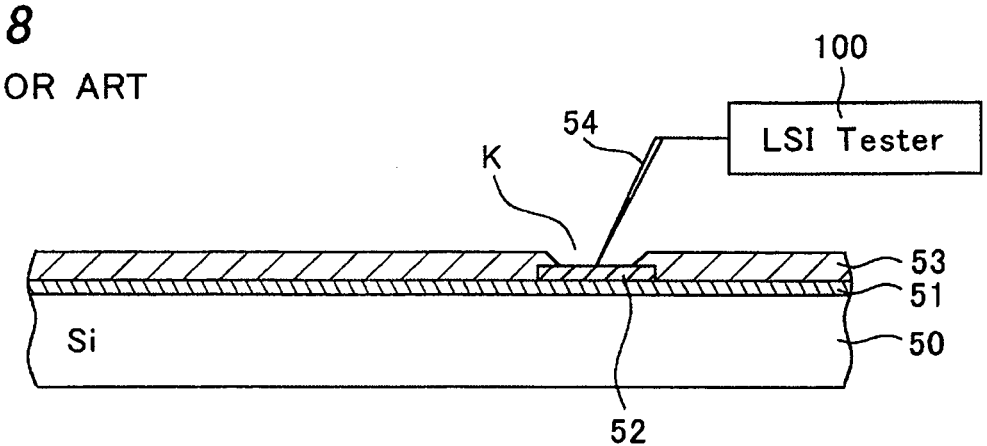
FIGS. 8 and 9 are cross-sectional views showing a method of manufacturing a semiconductor device of a conventional art.
Figure 9:
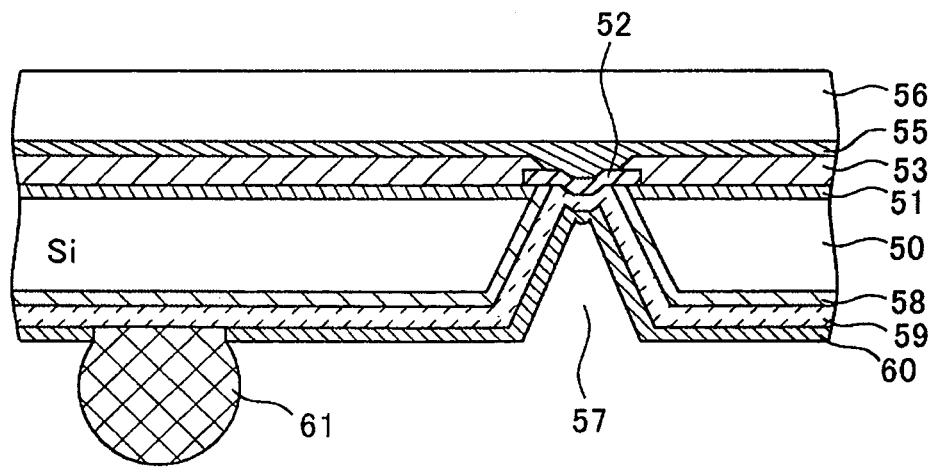

Next, a second protection film 11 made of a resist material or the like for example, a solder resist is formed on the back surface of the semiconductor substrate 1 as shown in FIG. 7. An opening is provided in the second protection layer 11 on a portion of the wiring layer 10. Then, a ball-shaped conductive terminal 12 made of, for example, metal such as solder is formed on the wiring layer 10 exposed in this opening by a screen printing method, thereby forming the BGA type semiconductor device.

When the semiconductor device of the invention is of an LGA (Land Grid Array) type, it is not necessary to form the conductive terminal 12 on a portion of the wiring layer 10 partially exposed from the second protection layer 11.

In the embodiments above, because of the second pad electrode that is connected to the first pad electrode and used as the testing pad electrode, the first pad electrode for connection can be prevented from being damaged. Furthermore, since the second pad electrode is used as a pad for measuring an electronic circuit, it is not necessary to provide an opening to the first protection film for the first pad electrode, so that the first pad electrode is covered by the first protection film and stably fixed. This prevents the influence of the heat treatment after the via hole is formed, and solves the problem of warping the first pad electrode.

Figure 10:
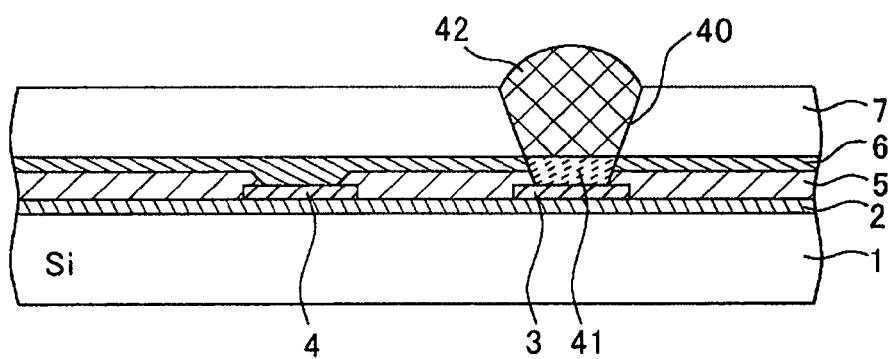
FIG. 10 show a cross-sectional view showing a method of manufacturing a semiconductor device of another embodiment.

It is also possible to provide a via hole 40 reaching the first pad electrode 3 on the supporting body 7 side as shown in FIG. 10 after the supporting body 7 is attached to the semiconductor substrate 1 as shown in FIG. 4. Then, a metal layer 41 (e.g. a laminated layer of a nickel layer and a gold layer) is formed on the first pad electrode 3 by, for example, a plating method, and then a conductive terminal 42 made of solder or the like is provided in the via hole 40 as a wiring layer. This can also prevent the first pad electrode 3 for connection from being damaged and corroding. It is possible to form the metal layer 41 on the first pad electrode 3 before the supporting body 7 is attached to the semiconductor substrate 1.

What is claimed is:

1. A semiconductor device comprising:
    a semiconductor substrate comprising a front surface and a back surface and having a via hole connecting the front and back surfaces;
    an electronic circuit disposed on the front surface;
    a first pad electrode disposed on the front surface so as to cover the via hole and connected with the electronic circuit;
    a second pad electrode disposed on the front surface and connected with the first pad electrode;
    a protection film disposed on the front surface so as to cover the whole first pad electrode and having an opening to expose part of the second pad electrode;
    an inorganic supporting body attached to the front surface of the semiconductor substrate;
    an organic attachment layer attaching the inorganic supporting body to the semiconductor substrate and being in contact with the exposed part of the second pad electrode through the opening in the protection film; and
    a wiring layer disposed on the back surface so as to be in contact with the first pad electrode through the via hole,
    wherein the semiconductor device is configured to be mounted on a circuit board.

2. The semiconductor device of claim 1, further comprising a conductive terminal disposed on the wiring layer.

3. A method of manufacturing a semiconductor device, comprising:
    providing a device intermediate comprising a semiconductor substrate, an electronic circuit disposed on a front surface of the semiconductor substrate, a first pad electrode disposed on the front surface and connected with the electronic circuit and a second pad electrode disposed on the front surface and connected with the first pad electrode;
    forming a protection film on the front surface so as to cover the first pad electrode and not to cover part of the second pad electrode;
    bringing a measuring needle in contact with the part of the second pad electrode that is not covered by the protection film for testing the electronic circuit;
    forming a via hole from a back surface of the semiconductor substrate toward the first pad electrode; and
    forming a wiring layer on the back surface so as to be in contact with the first pad electrode through the via hole.

4. The method of claim 3, further comprising attaching a supporting body to the front surface of the semiconductor substrate.

5. The method of claim 3, further comprising forming a conductive terminal on the wiring layer.

6. A method of manufacturing a semiconductor device, comprising:
    forming on a front surface of a semiconductor substrate an electronic circuit, a first pad electrode and a second pad electrode that are connected together;
    bringing a measuring needle in contact with the second pad electrode for testing the electronic circuit;
    attaching a support body to the front surface so as to cover the first and second pad electrodes;
    forming a via hole through the semiconductor substrate or the support body so as to provide a conduit for electrical connection to the first pad electrode and forming no via hole to provide a conduit for electrical connection to the second pad electrode; and
    forming a wiring layer so as to be in contact with the first pad electrode through the via hole.

7. The method of claim 6, further comprising forming the wiring layer on a back surface of the semiconductor substrate.

8. The method of claim 6, further comprising forming the wiring layer in the via hole.

9. A semiconductor device comprising:
    a semiconductor substrate comprising a front surface and a back surface;

an electronic circuit disposed on the front surface;

a supporting body attached to the front surface of the semiconductor substrate and having a via hole formed therein;

a pad electrode for external connection disposed on the front surface so as to cover the via hole and connected with the electronic circuit;

a pad electrode for testing disposed on the front surface and connected with the pad electrode for external connection; and a wiring layer disposed in the via hole so as to be in contact with the pad electrode for external connection.

10. The semiconductor device of claim 9, further comprising an attachment layer attaching the supporting body and the semiconductor substrate.

11. The method of claim 6, wherein the first and second pad electrodes are formed in the same process step.

12. A semiconductor device comprising:

a semiconductor substrate comprising a front surface and a back surface;

an electronic circuit disposed on the front surface;

a first pad electrode disposed on the front surface and connected with the electronic circuit;

a second pad electrode disposed on the front surface and connected with the first pad electrode;

a protection film disposed on the front surface so as to cover the whole front surface of the first pad electrode and having an opening to expose part of the second pad electrode;

an inorganic supporting body attached to the front surface of the semiconductor substrate;

an organic attachment layer attaching the inorganic supporting body to the semiconductor substrate and being in contact with the exposed part of the second pad electrode through the opening in the protection film; and a wiring layer disposed on the back surface so as to be in contact with a back surface of the first pad electrode, wherein the semiconductor device is configured to be mounted on a circuit board.

13. A method of manufacturing a semiconductor device, comprising:

providing a device intermediate comprising a semiconductor substrate, an electronic circuit disposed on a front surface of the semiconductor substrate, a first pad electrode disposed on the front surface and connected with the electronic circuit and a second pad electrode disposed on the front surface and connected with the first pad electrode;

forming a protection film on the front surface so as to cover a front surface of the first pad electrode and not to cover part of the second pad electrode;

bringing a measuring needle in contact with the part of the second pad electrode that is not covered by the protection film for testing the electronic circuit;

exposing a back surface of the first pad electrode; and forming a wiring layer on the back surface so as to be in contact with the exposed back surface of the first pad electrode.

* * * * *